(12) United States Patent
Sun

(10) Patent No.: US 11,169,554 B2
(45) Date of Patent: Nov. 9, 2021

(54) VOLTAGE REGULATOR CIRCUITRY

(71) Applicant: Cirrus Logic International Semiconductor Ltd., Edinburgh (GB)

(72) Inventor: Daiwen Sun, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 8 days.

(21) Appl. No.: 16/828,463

(22) Filed: Mar. 24, 2020

(65) Prior Publication Data

US 2021/0303013 A1    Sep. 30, 2021

(51) Int. Cl.
*G05F 1/46* (2006.01)
*G05F 1/575* (2006.01)
*G11C 5/14* (2006.01)

(52) U.S. Cl.
CPC .............. *G05F 1/575* (2013.01); *G11C 5/147* (2013.01)

(58) Field of Classification Search
None
See application file for complete search history.

(56) References Cited

U.S. PATENT DOCUMENTS

| | | | | |
|---|---|---|---|---|
| 6,150,860 A * | 11/2000 | Chun | ................. | G05F 1/465 323/267 |
| 7,383,138 B2 * | 6/2008 | Ito | ................. | G06F 1/3287 702/60 |
| 7,492,646 B2 * | 2/2009 | Lee | ................. | G05F 1/465 365/189.07 |
| 7,701,690 B1 * | 4/2010 | Li | ................. | H02M 3/1584 361/159 |
| 8,710,914 B1 * | 4/2014 | Guhados | ................. | G05F 1/565 327/540 |
| 8,981,750 B1 * | 3/2015 | Meher | ................. | G05F 1/575 323/282 |
| 10,444,780 B1 * | 10/2019 | Cheng | ................. | H03F 3/45179 |
| 2006/0119421 A1 * | 6/2006 | Kouno | ................. | G05F 1/56 327/541 |
| 2009/0295774 A1 * | 12/2009 | Okamoto | ................. | G11C 5/063 345/211 |
| 2021/0124383 A1 * | 4/2021 | Iguchi | ................. | G05F 1/575 |

* cited by examiner

*Primary Examiner* — Thomas J. Hiltunen
(74) *Attorney, Agent, or Firm* — Jackson Walker L.L.P.

(57) ABSTRACT

The present disclosure relates to voltage regulator circuitry comprising an input for receiving a supply voltage, an output for outputting an output voltage, and control circuitry configured to receive a reference voltage. The voltage regulator circuitry is selectively operable in either a closed-loop mode in which the control circuitry receives a voltage indicative of the output voltage such that the voltage regulator circuitry regulates the output voltage based on the voltage indicative of the output voltage and the reference voltage received by the control circuitry or an open-loop mode in which the control circuitry does not receive the voltage indicative of the output voltage and the voltage regulator circuitry regulates the output voltage based on the reference voltage received by the control circuitry.

8 Claims, 8 Drawing Sheets

VOLTAGE REGULATOR CIRCUITRY

FIELD OF THE INVENTION

The present disclosure relates to the field of voltage regulator circuitry.

BACKGROUND

In battery powered devices such as mobile telephones, tablet and laptop computers, portable media players, gaming devices, wearable devices and the like, or accessory devices for such devices, voltage regulator circuitry is commonly used to provide a stable and accurate regulated supply voltage to a load of the device, such as internal circuitry and subsystems of the device. Thus the voltage regulator circuitry receives an unregulated voltage from a battery of the device and outputs a regulated voltage to the load.

A common form of voltage regulator circuitry is a low drop-out regulator (also referred to as an LDO). LDO circuitry is able to provide a stable and accurate regulated output voltage even when the regulated output voltage is close to the voltage supplied to the LDO circuitry, e.g. from a battery.

LDO circuitry provides a highly accurate output voltage, but can be slow to reach or return to its steady state following a transient such as a sudden change in load current. In some circumstances this slow transient response can be disadvantageous.

SUMMARY

According to a first aspect, the invention provides voltage regulator circuitry comprising:
an input for receiving a supply voltage;
an output for outputting an output voltage; and
control circuitry configured to receive a reference voltage,
wherein the voltage regulator circuitry is selectively operable in either:
  a closed-loop mode in which the control circuitry receives a voltage indicative of the output voltage such that the voltage regulator circuitry regulates the output voltage based on the voltage indicative of the output voltage and the reference voltage received by the control circuitry; or
  an open-loop mode in which the control circuitry does not receive the voltage indicative of the output voltage and the voltage regulator circuitry regulates the output voltage based on the reference voltage received by the control circuitry.

The voltage regulator circuitry may comprise low drop-out regulator circuitry, for example.

The control circuitry may be operable in the closed-loop mode to:
compare the voltage indicative of the output voltage to the reference voltage; and
adjust the output voltage according to the comparison.

The control circuitry may comprise comparator circuitry, for example.

The voltage regulator circuitry may comprise a feedback path operable to selectively supply the voltage indicative of the output voltage to the control circuitry.

The feedback path may comprise a switch, wherein:
when the switch is closed the feedback path supplies the voltage indicative of the output voltage to the control circuitry such that the voltage regulator circuitry operates in the closed-loop mode; and
when the switch is open the feedback path does not supply the voltage indicative of the output voltage to the control circuitry such that the voltage regulator circuitry operates in the open-loop mode.

The voltage regulator circuitry may comprise circuitry implementing a controllable resistance, and the control circuitry may be operative to regulate the output voltage by adjusting a resistance value of the controllable resistance.

The voltage indicative of the output voltage may comprise a portion of the output voltage.

According to a second aspect, the invention provides a system comprising:
first voltage regulator circuitry operable to supply a first regulated output voltage to a load;
second voltage regulator circuitry operable to supply a second regulated output voltage to the load; and
controller circuitry operative to selectively enable one of the first and second regulator circuitry and disable the other of the first and second regulator circuitry so as to supply either the first regulated output voltage or the second regulated output voltage to the load.

The second voltage regulator circuitry may be selectively operable in either:
an open-loop mode in which the second regulated output voltage is regulated based on a reference voltage; or
a closed-loop mode in which the second regulated output voltage is regulated based on the reference voltage and a voltage indicative of the second regulated output voltage.

The system may be configured to control the operation of the second voltage regulator circuitry such that:
when the second voltage regulator circuitry is enabled, the second voltage regulator circuitry is operative in the open-loop mode for a first period of time and;
after expiry of the first period of time, the second voltage regulator circuitry is operative in the closed-loop mode.

The system may be configured to control the operation of the second voltage regulator circuitry such that:
when the second voltage regulator circuitry is operative in the closed-loop mode a magnitude of the second regulated output voltage decreases over time.

The system may be configured to control the operation of the second voltage regulator circuitry such that the magnitude of the second regulated output voltage decreases in one or more steps over time, for example.

The first and second voltage regulator circuitry may comprise low drop-out regulator circuitry.

The second voltage regulator circuitry may have lower power consumption than the first voltage regulator circuitry.

The load may comprise RAM, for example.

According to a third aspect, the invention provides a device comprising:
RAM; and
voltage regulator circuitry, wherein the voltage regulator circuitry is operative in an open-loop mode or a closed-loop mode to provide a supply voltage to the RAM.

The voltage regulator circuitry may comprise:
an input for receiving a supply voltage;
an output for outputting an output voltage; and
control circuitry configured to receive a reference voltage,
wherein in operation in the closed-loop mode, the control circuitry receives a voltage indicative of the output voltage such that the voltage regulator circuitry regulates the output voltage based on the voltage indicative of the output voltage and the reference voltage received by the control circuitry; and wherein in operation in the open-loop mode, the control circuitry does not receive the voltage indicative of the output voltage and the voltage regulator circuitry regulates the output voltage based on the reference voltage received by the control circuitry.

According to a fourth aspect, the invention provides integrated circuitry comprising voltage regulator circuitry according to the first aspect.

According to a fifth aspect, the invention provides a device comprising the voltage regulator circuitry according to the first aspect. The device may comprise a mobile telephone, a tablet or laptop computer, a portable media player, a gaming device, a wearable device or an accessory device, for example.

BRIEF DESCRIPTION OF THE DRAWINGS

Embodiments of the invention will now be described, strictly by way of example only, with reference to the accompanying drawings, of which.

DETAILED DESCRIPTION

Figure 1:
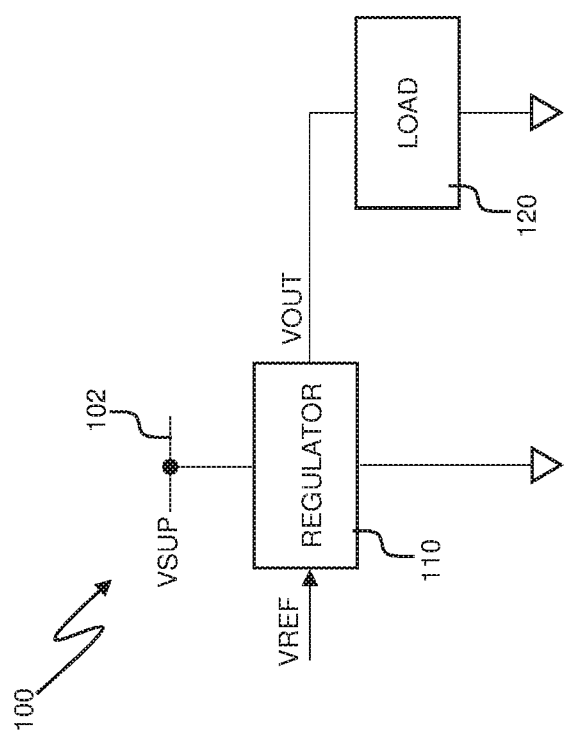
FIG. 1 is a schematic diagram illustrating the use of a voltage regulator to provide a supply voltage to a load.

Referring first to FIG. 1, a system incorporating voltage regulator circuitry is shown generally at 100. The system may form part of a host device such as a mobile telephone, laptop or tablet computer, gaming device, wearable device or the like, or an accessory device (e.g. headphones, earphones, earbuds, a headset etc.) for such a device.

The system 100 includes a supply voltage rail 102 which is coupled to a power supply, such as an on-board battery of the host device, that provides a supply voltage VSUP. The voltage regulator circuitry 110 is coupled to the supply voltage rail 102 so as to receive the supply voltage VSUP. The voltage regulator circuitry 110 also receives a stable reference voltage VREF such as a bandgap reference voltage.

The voltage regulator circuitry 110 is configured to output a regulated supply voltage VOUT based on the reference voltage VREF to a load 120, which may comprise, for example, integrated circuitry that implements logic, computation, memory and/or signal processing functionality. The voltage regulator circuitry 110 may comprise low drop-out regulator (LDO) circuitry, for example.

The voltage regulator circuitry 110 of the system 100 is able to provide a supply voltage to the load 120, which remains stable and accurate even as the supply voltage VSUP and/or the load 120 varies, for example as the on-board battery of the host device discharges over time and through use of the host device.

Figure 2:
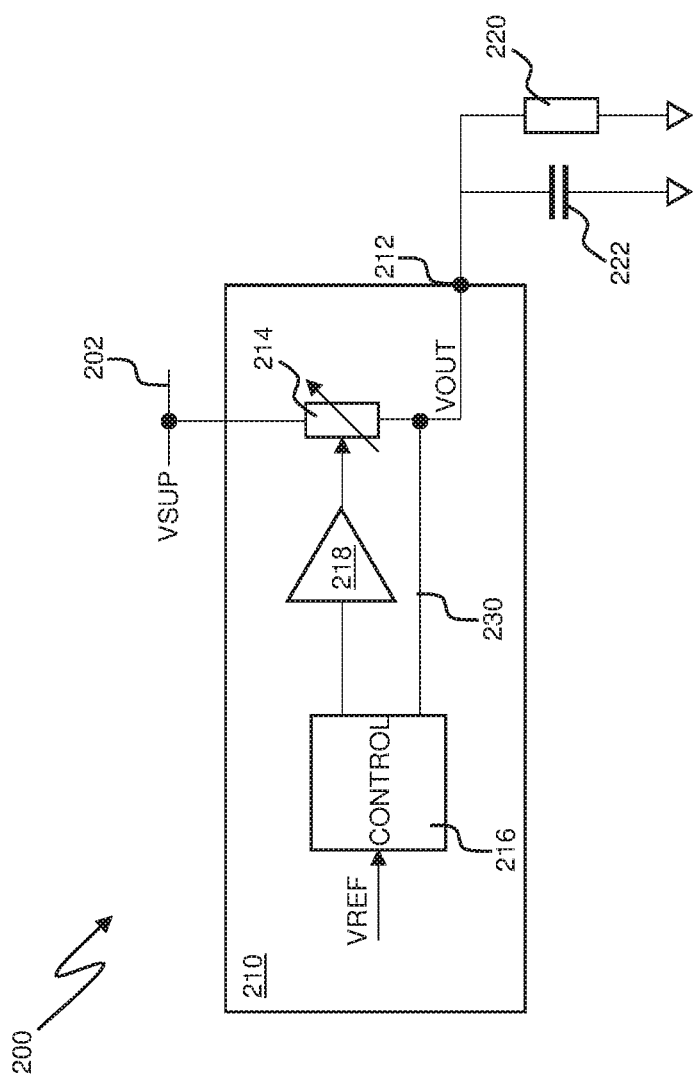
FIG. 2 is a schematic diagram illustrating the principle of operation of a voltage regulator.

FIG. 2 is a schematic illustration showing the principle of operation of typical voltage regulator circuitry used to provide a regulated supply voltage to a load.

In the system shown generally at 200 in FIG. 2, a supply voltage rail 202 is coupled to a power supply, such as an on-board battery of a host device, that provides a supply voltage VSUP. The voltage regulator circuitry 210 is coupled to the supply voltage rail 202 so as to receive the supply voltage VSUP. The voltage regulator circuitry 210 is configured to output a regulated supply voltage VOUT to a load 220 coupled to an output terminal or node 212 of the voltage regulator circuitry 210. The load 220 may comprise, for example, integrated circuitry that implements logic, memory, computation and/or signal processing functionality. A capacitance 222 may be coupled to the output terminal or node 212 in parallel with the load 220.

The voltage regulator circuitry 210 includes circuitry implementing a controllable resistance 214. The controllable resistance may be implemented in any convenient manner, but is typically implemented using one or more transistors. The combination of the controllable resistance 214 and the resistance of the load 220 determines the output voltage VOUT output by the voltage regulator circuitry 210 at the output terminal or node 212. Thus, by adjusting the resistance value of the controllable resistance 214 to compensate for changes to the supply voltage VSUP and/or the load 220, a constant output voltage VOUT can be maintained.

To this end, the voltage regulator circuitry 210 further includes control circuitry 216 which receives a stable reference voltage VREF from, for example, a bandgap voltage reference. The control circuitry 216 receives the regulated supply voltage VOUT output by the voltage regulator circuitry 210 (or a portion thereof) via a feedback path 230 that couples the output terminal or node 212 to the control circuitry 216. The control circuitry 216 compares the regulated supply voltage VOUT (or the portion thereof) to the reference voltage VREF and outputs a control signal to error amplifier circuitry 218. For example the control circuitry 216 may include comparator circuitry which performed the comparison of the regulated supply voltage VOUT (or the portion thereof) to the reference voltage VREF. The error amplifier circuitry 218 in turn outputs a control signal to the controllable resistance 214 to adjust the resistance value of the controllable resistance 214 in order to minimise an error between the output voltage VOUT and the reference voltage VREF, thus to maintain the output voltage VOUT at a desired level. As will be appreciated, the voltage regulator circuitry 210 therefore operates in a closed-loop manner.

One disadvantage of voltage regulator circuitry 210 of the kind illustrated in FIG. 2 is that it can be slow to respond to changes in the supply voltage VSUP or the load 220, and so reaching or returning to the desired output voltage VOUT can take a relatively long time. In steady-state operation of a host system or device incorporating such regulator circuitry 210 this may not cause any problems, but a slow response by the voltage regulator circuitry 210 to changes or transients in the supply voltage VSUP or load 220 may be disadvantageous.

Figure 3:
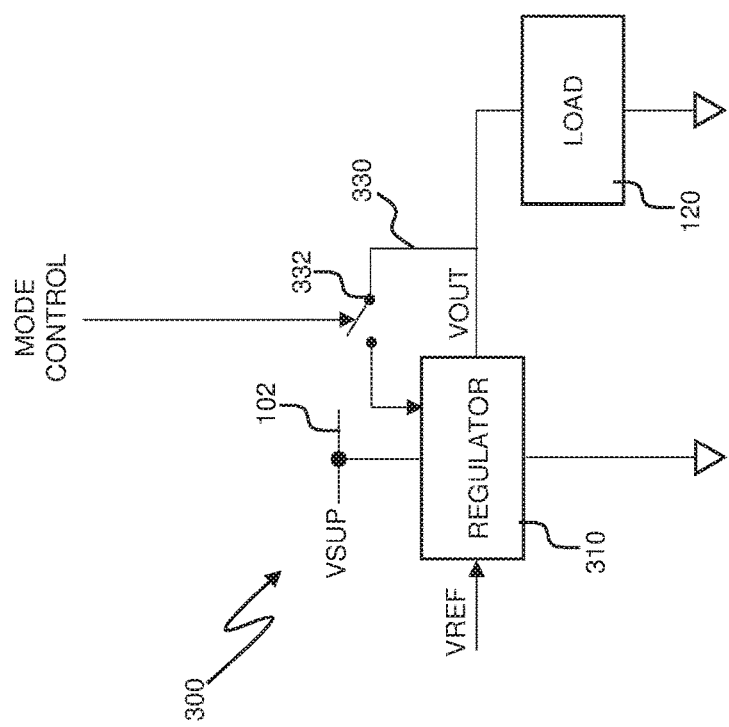
FIG. 3 is a schematic diagram illustrating the use of voltage regulator circuitry according to the present disclosure to provide a supply voltage to a load.

FIG. 3 is a schematic block diagram illustrating a system including voltage regulator circuitry that is selectively operable in either a closed-loop mode or an open-loop mode.

The system, shown generally at 300 in FIG. 3, is similar to the system 100 illustrated in FIG. 1, and thus elements that are common to the systems of FIGS. 1 and 3 are denoted by common reference numerals.

The system 300 includes a supply voltage rail 102 which is coupled to a power supply, such as an on-board battery of a host device, that provides a supply voltage VSUP. The voltage regulator circuitry 310 is coupled to the supply voltage rail 102 so as to receive the supply voltage VSUP. The voltage regulator circuitry 310 also receives a stable reference voltage VREF such as a bandgap reference voltage.

The voltage regulator circuitry 310 is configured to output a regulated supply voltage VOUT to a load 120, which may comprise, for example, integrated circuitry that implements logic, computation, memory and/or signal processing functionality. The voltage regulator circuitry 310 may comprise or implement low drop-out regulator (LDO) circuitry, for example.

The system 300 of FIG. 3 differs from the system 100 of FIG. 1 in that the voltage regulator circuitry 310 is selectively operable in a closed-loop mode or an open-loop mode. To this end, the system 300 includes a feedback path 330 that feeds at least a portion of the output voltage VOUT back to the voltage regulator circuitry 310. The feedback path 330 includes a controllable switch device (e.g. a transistor) that can be closed or opened in accordance with a mode control signal (provided by an external controller, e.g. a main processor or an applications processor of the host device) to switch the regulator circuitry 310 between its closed-loop and open-loop modes.

Thus when the switch 332 is closed (in response to receiving a suitable mode control signal from the external controller) the regulator circuitry 310 operates in its closed-loop mode, receiving at least a portion of the output voltage VOUT and regulating the output voltage based upon the portion of the output voltage VOUT that is fed back and the reference voltage VREF.

When the switch 332 is open (in response to receiving a suitable mode control signal from the external controller) the regulator circuitry 310 operates in its open-loop mode. In the open-loop mode the regulator circuitry 310 does not receive any portion of the output voltage. Thus in the open-loop mode the regulator circuitry 310 regulates the output voltage VOUT based on the reference voltage VREF alone.

When operating in the closed-loop mode the regulator circuitry 310 regulates the output voltage VOUT based on a comparison between the portion of the output voltage VOUT that is fed back to the regulator circuitry 310 and the reference voltage, aiming to minimise an error between the output voltage VOUT and the reference voltage VREF. As described above, in this closed-loop mode the voltage regulator circuitry 310 may be relatively slow to reach or return to a desired output voltage VOUT because a number of iterations adjusting the configuration of the regulator circuitry 310 (e.g. adjusting the resistance value of an adjustable resistance of the regulator circuitry 310) may be required before the desired output voltage VOUT is achieved (within an acceptable tolerance where appropriate). However, the continuous feedback control of the output voltage VOUT when the voltage regulator circuitry 310 is operating in its closed-loop mode results in a highly accurate and stable steady-state output voltage VOUT.

In contrast, when operating in the open-loop mode the regulator circuitry 310 regulates the output voltage VOUT based only on the reference voltage VREF. Thus, determining the level of the output voltage VOUT is a one-shot process without any iterations, which means that a desired output voltage VOUT can be provided very quickly, at the cost of reduced steady-state accuracy and stability, in comparison to operation in the closed-loop mode, because with the switch 332 open there is no mechanism to adjust the output voltage VOUT in response to changes in the supply voltage VSUP or the load 120.

Thus the voltage regulator circuitry 310 is able to dynamically switch between a high-speed but low accuracy open-loop mode and a lower speed but higher accuracy closed-loop mode of operation.

The voltage regulator circuitry 310 is particularly suited for use in a system or host device in which a component or subsystem is tolerant to variations in its supply voltage but is intolerant to delay in providing a supply voltage of a particular value. An example is the use of the voltage regulator circuitry 310 in such a system is provided below.

Figure 4:
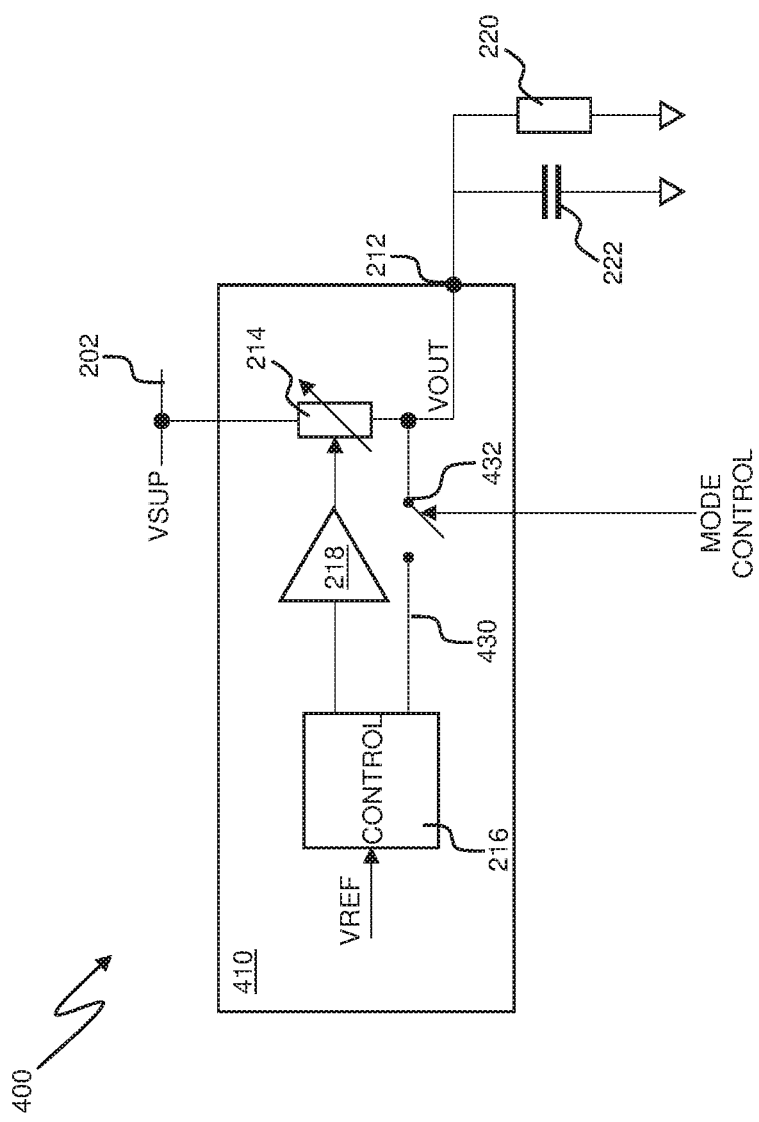
FIG. 4 is a schematic diagram illustrating the principle of operation of voltage regulator circuitry according to the present disclosure.

FIG. 4 is a schematic illustration showing the principle of operation of voltage regulator circuitry in accordance with the present disclosure.

A system incorporating voltage regulator circuitry is shown generally at 400 in FIG. 4. The system 400 is similar to the system 200 illustrated in FIG. 2, and thus elements that are common to the systems of FIGS. 2 and 4 are denoted by common reference numerals.

The system 400 differs from that of FIG. 2 in that a feedback path 430 that couples the output terminal or node 212 to the control circuitry 216 of the voltage regulator circuitry 410 includes a controllable switch 432 (e.g. a transistor) that permits the voltage regulator circuitry 410 to operate in either a closed-loop mode or an open-loop mode in accordance with a mode control signal received, for example, from a controller such as a main processor or an applications processor of a host device.

Thus when the switch 432 is closed (in response to receiving a suitable mode control signal from an external controller) the regulator circuitry 410 operates in its closed-loop mode, as described above with reference to FIG. 2.

When the switch 432 is opened (in response to receiving a suitable mode control signal from the external controller) the regulator circuitry 410 operates in its open-loop mode. In this mode the regulator circuitry 410 regulates the output voltage VOUT based only on the reference voltage VREF. Thus, the error signal output by the control circuitry 216 is based on the reference voltage VREF alone (i.e. the difference between VREF and 0V, since no feedback signal is received by the control circuitry 216), and the error amplifier 218 in turn outputs a control signal to the controllable resistance 214 to set the resistance value of the controllable resistance 214. As will be appreciated by those of ordinary skill in the art, by adjusting the reference voltage VREF the regulated output voltage VOUT can be varied.

Thus in the open-loop mode of operation of the voltage regulator circuitry 410 a desired value of the output voltage VOUT, based on the reference voltage VREF, can quickly be reached, as setting the value of the output voltage VOUT is a one-shot process with no iterations.

Through the use of appropriate mode control signals to the switch 432, the voltage regulator can be made to operate initially in its open-loop mode so as to achieve a desired output voltage VOUT quickly, e.g. in anticipation of a sudden or transient change in the load 220 or the supply voltage VSUP, and then to switch to its closed-loop mode for steady-state operation to ensure a stable and accurate output voltage VOUT in the face of changes to the supply voltage VSUP or load 220 over time.

Figure 5:
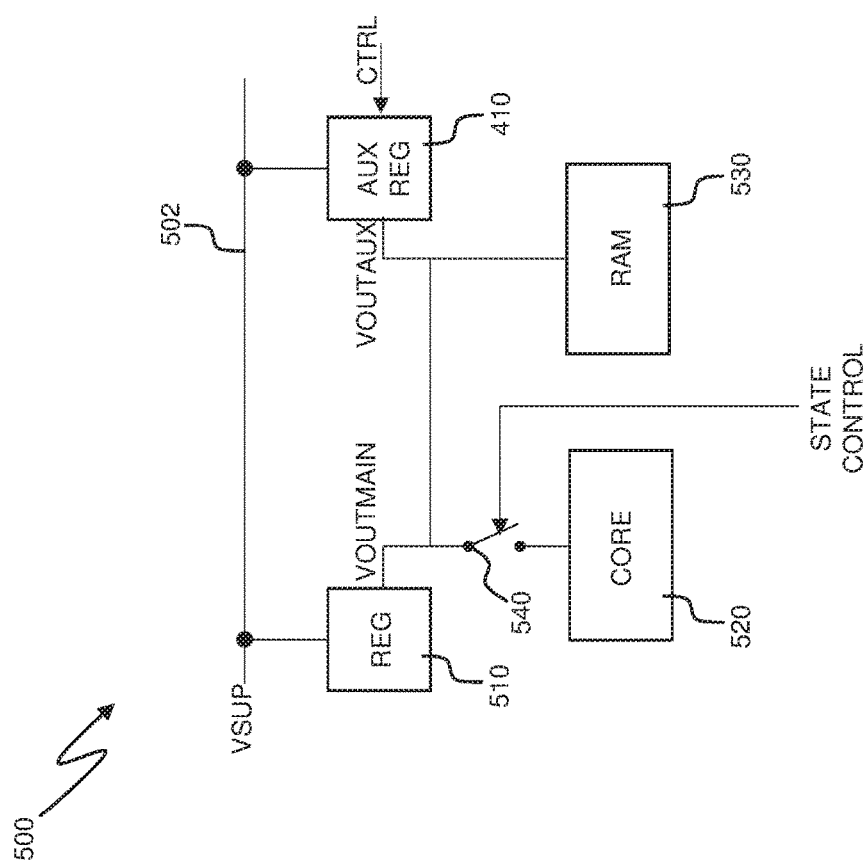
FIG. 5 is a schematic diagram illustrating circuitry including auxiliary voltage regulator circuitry to provide a supply voltage to a RAM.

FIG. 5 is a schematic representation of a system incorporating voltage regulator circuitry that is configured selectively to operate in either an open-loop mode or a closed-loop mode.

The system, shown generally at 500 in FIG. 5, includes a supply voltage rail 502, which receives a supply voltage VSUP, for example from a battery of a host device such as a mobile telephone, laptop or tablet computer, gaming device, wearable device or the like, or an accessory device (e.g. headphones, earphones, earbuds, a headset etc.) that incorporates the system 500.

The system 500 further includes main or first voltage regulator circuitry 510, which is configured to receive the supply voltage and to output a main regulated output voltage VOUTMAIN to components of the system 500 including a load 220 (which may be, for example, a processing core) and a RAM 530.

A controllable state control switch 540 is provided in a power supply path from the main regulator circuitry 510 to the processing core 520. The controllable state control switch 540 can be closed to couple the processing core 520 to the main voltage regulator circuitry 510 such that it receives the main regulated output voltage VOUTMAIN from the main regulator circuitry 510, or opened to decouple the processing core 520 from the main voltage regulator circuitry 510 such that it does not receive the main regulated output voltage VOUTMAIN from the main regulator circuitry 510, thus powering off the processing core 520.

The system further includes second or auxiliary voltage regulator circuitry 410, of the kind described above with reference to FIGS. 3 and 4. The second or auxiliary voltage regulator circuitry 410 is configured to receive the supply voltage VSUP and to provide an auxiliary regulated output voltage VOUTAUX to the RAM 530 when the main or first voltage regulator circuitry 510 is disabled, as will be described below.

The second or auxiliary voltage regulator circuitry 410 is configured to be enabled (e.g. powered on) or disabled (e.g. powered off or down) in response to a control signal CTRL, which may be provided, for example, by a main processor or an applications processor of the host device.

The second or auxiliary voltage regulator circuitry 410 consumes less power than the first or main voltage regulator circuitry 510. For example, the second or auxiliary voltage regulator circuitry 410 may implement a low-power LDO (e.g. an LDO having a quiescent current of the order of 1.5 $\mu A$), whereas the first or main voltage regulator circuitry 510 may implement a voltage regulator (e.g. an LDO) having a quiescent current of the order of 100 $\mu A$ or more.

In normal operation of the system the controllable state control switch 540 is closed such the processing core 520 receives the main regulated output voltage VOUTMAIN from the main regulator circuitry 510. The auxiliary voltage regulator circuitry 410 is thus disabled, e.g. by an appropriate control signal CTRL from a main processor or an applications processor of the host device.

The host device may need to enter a low-power, sleep or hibernate mode, in which certain internal components and/or sub-systems may be switched off or powered down in order to reduce the power consumption of the host device, thereby prolonging the battery life of the host device.

In such a mode, the controllable state control switch 540 is opened, in response to an appropriate state control signal (issued, for example, by a main or applications processor of the host device) to power off the processing core 520 to reduce power consumption. The main voltage regulator circuitry 510 is also disabled, to further reduce power consumption, and thus the main regulated output voltage VOUTMAIN is no longer available to power the RAM 530. However, it is advantageous for the RAM 530 to continue to receive a supply voltage, in order to retain data (e.g. state data) that is stored in the RAM, in order to reduce the time taken for the system 500 to return to full operation when the host device reverts to a normal mode of operation.

To this end, the second or auxiliary regulator circuitry 410 may be enabled when the device enters the low-power, sleep or hibernate mode. Thus, a suitable control signal CNTRL may be issued to the second or auxiliary voltage regulator circuitry 410 at an appropriate time, e.g. immediately before controllable state control switch 540 is opened, or immediately before the main voltage regulator circuitry 510 is disabled, to enable the auxiliary voltage regulator circuitry 410. As a result, the auxiliary voltage regulator circuitry 410 is able to provide the auxiliary supply voltage VOUTAUX to the RAM 530 when the main regulated output voltage VOUTMAIN is not available. This ensures that that the data stored in the RAM is retained while the host device is in the low-power, sleep or hibernate mode.

When the main voltage regulator circuitry 510 is disabled after the auxiliary voltage regulator circuitry 410 has been enabled, an immediate but transient increase in the load on the auxiliary voltage regulator circuitry 410 will occur. To ensure that the auxiliary supply voltage VOUTAUX to the RAM 530 is sufficient to meet a minimum supply voltage required by the RAM 530 to retain stored data during and after this transient load spike, the circuitry 510 performs a sequence of steps, as will now be described with reference to the timing diagram of FIG. 6.

At a time t0 a "$\overline{\text{Hibernate}}$" signal 610 is asserted (by a main or applications processor of the host device for example) to cause the host device to enter a low-power, sleep or hibernate mode. In the illustrated example the "$\overline{\text{Hibernate}}$" signal 610 is asserted by transitioning from a logic high voltage level to a logic low voltage level, but it will be appreciated by those of ordinary skill in the art that the "$\overline{\text{Hibernate}}$" signal 610 could be asserted in any convenient manner.

Following the assertion of the "$\overline{\text{Hibernate}}$" signal 610 at t0, an "Aux Reg Enable" signal 620 is asserted (by a main or applications processor of the host device for example) at a time t1, shortly after t0, to enable the auxiliary voltage regulator circuitry 410. The auxiliary voltage regulator circuitry 410 thus starts up in its open-loop mode of operation, as shown at 630 in FIG. 6.

Figure 6:
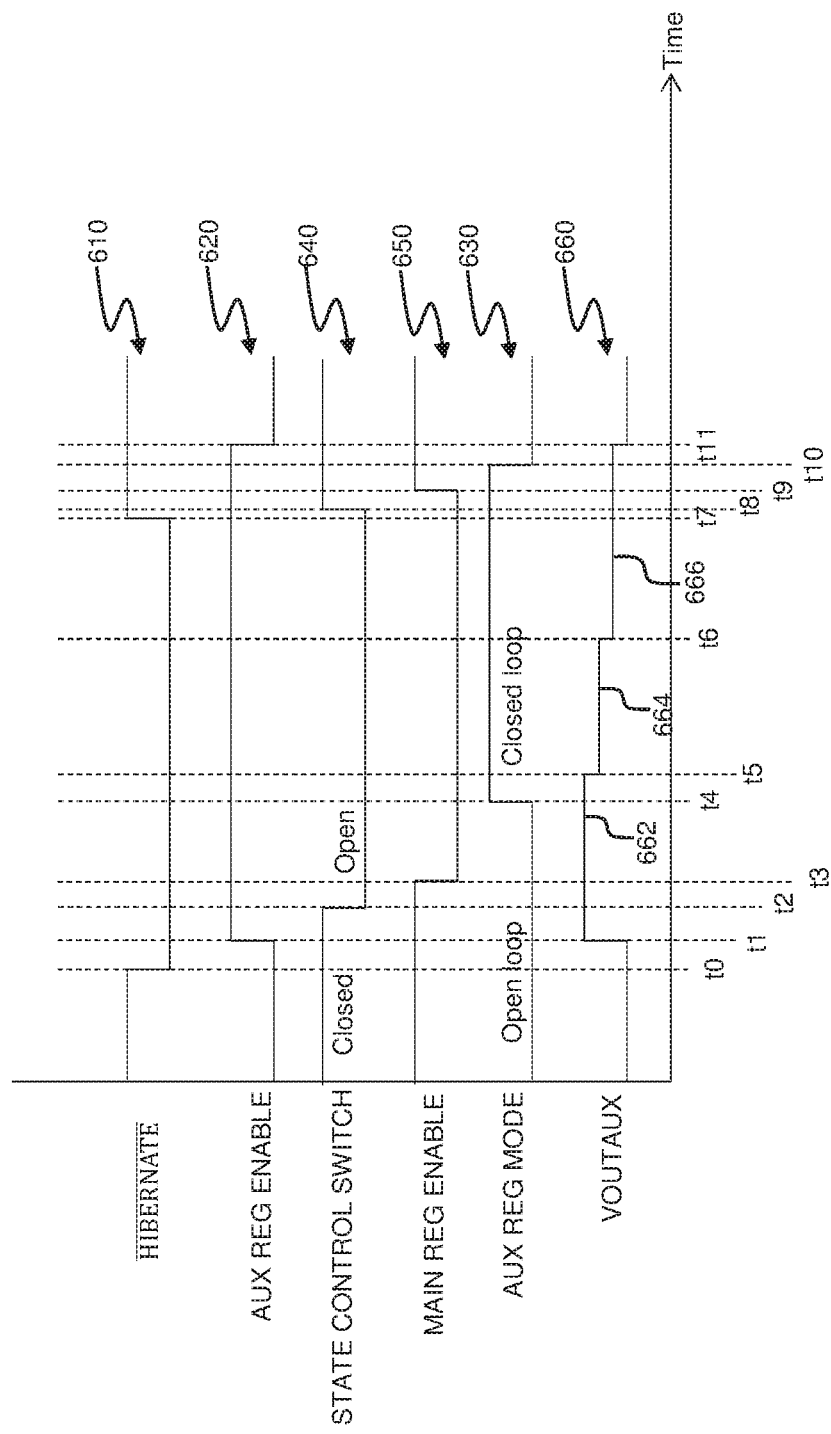
FIG. 6 is a timing diagram illustrating a sequence of steps performed by the circuitry of FIG. 5.

At a time t2, subsequent to t1, the state control switch 540 is opened in response to a suitable control signal, as shown at 640 in FIG. 6, to decouple the processing core 520 from the main voltage regulator circuitry 510, thereby powering down the processing core 520. With the processing core 520 powered down the main voltage regulator circuitry 510 can be disabled. Thus at a time t3 a "Main Reg Enable" signal output, for example, by the main processor or the applications processor of the host device, is de-asserted, as shown at 650 in FIG. 6.

In order to ensure that the auxiliary voltage regulator circuitry 410 is able to supply an auxiliary supply voltage VOUTAUX of sufficient magnitude to meet the minimum supply voltage requirement of the RAM 530 to retain stored data during the transient load spike that occurs immediately after the state control switch 540 has been opened, the auxiliary voltage regulator circuitry 410 continues to operate in its open-loop mode for period of time that is long enough to allow the transient load spike to settle to a steady state. In the open-loop mode the auxiliary voltage regulator circuitry 410 outputs the auxiliary supply voltage VOUTAUX at a first voltage magnitude 662, which provides sufficient supply voltage headroom to accommodate the load spike without dropping below the minimum supply voltage requirement of the RAM 530. For example, if the RAM has a minimum supply voltage requirement of 0.6 volts, the first voltage magnitude may be, for example, 1 volt.

At a time t4, subsequent to t3, the transient load spike has settled and the auxiliary regulator circuitry 410 switches to its closed-loop mode of operation, in response to an appropriate control signal. The control signal may be issued by, e.g. the main processor or the applications processor of the host device after a predetermined time period (corresponding to t4-t0) after the "Hibernate" signal has been asserted.

Once the auxiliary regulator circuitry 410 has commenced operating in its closed-loop mode, the magnitude of its regulated output voltage VOUTAUX may be gradually reduced (e.g. stepped down) to further reduce power consumption without compromising data retention in the RAM 530. Thus in the example illustrated in FIG. 6, the magnitude of the regulated output voltage VOUTAUX is reduced to a second voltage magnitude 664 (e.g. 0.8 volts) in a first step at a time t5, and is further reduced to a third voltage magnitude 666 (e.g. 0.7 volts) in a second step at a time t6. As will be appreciated by those of ordinary skill in the art, more or fewer steps may be provided to reduce the regulated output voltage VOUTAUX of the auxiliary voltage regulator circuitry 410, or the regulated output voltage VOUTAUX of the auxiliary voltage regulator circuitry 410 could be ramped rather than stepped down.

At a time t7, the "Hibernate" signal 610 is de-asserted to cause the host device to resume normal operation. The state control switch 540 thus receives a control signal at time t8 causing the state control switch to close, thereby re-coupling the processing core 520 to the main voltage regulator circuitry 510.

At a time t9 the "Main Reg Enable" signal 650 is re-asserted to re-enable the main voltage regulator circuitry 510. Subsequently at a time t10 the auxiliary regulator circuitry 410 returns to its open-loop mode of operation so that the next time it is enabled it will start up in open-loop mode, before at time t11 the "Aux Reg Enable" signal 620 is de-asserted to disable the voltage auxiliary regulator circuitry 410.

This sequence and the times t0-t11 at which particular actions are performed or signals are asserted or de-asserted are controlled by a central controller such as a main processor or applications processor of the host device, and enable the host device to safely enter its low power or hibernate mode whilst still retaining data such as boot data stored in the RAM 530, thus allowing the host device to quickly resume normal operation by retrieving the data stored in the RAM 530.

Figure 7:
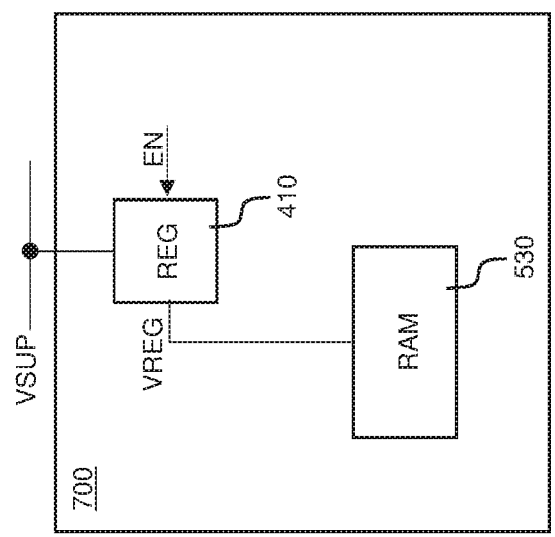
FIG. 7 is a schematic diagram illustrating circuitry comprising voltage regulator circuitry and a RAM.

As illustrated in FIG. 7, in some implementations a RAM 530 (e.g. a DRAM or SRAM) may be integrated or otherwise supplied with voltage regulator circuitry 410 of the kind described above in a single device 700, e.g. a single block of an integrated circuit or a single integrated circuit.

Figure 8:
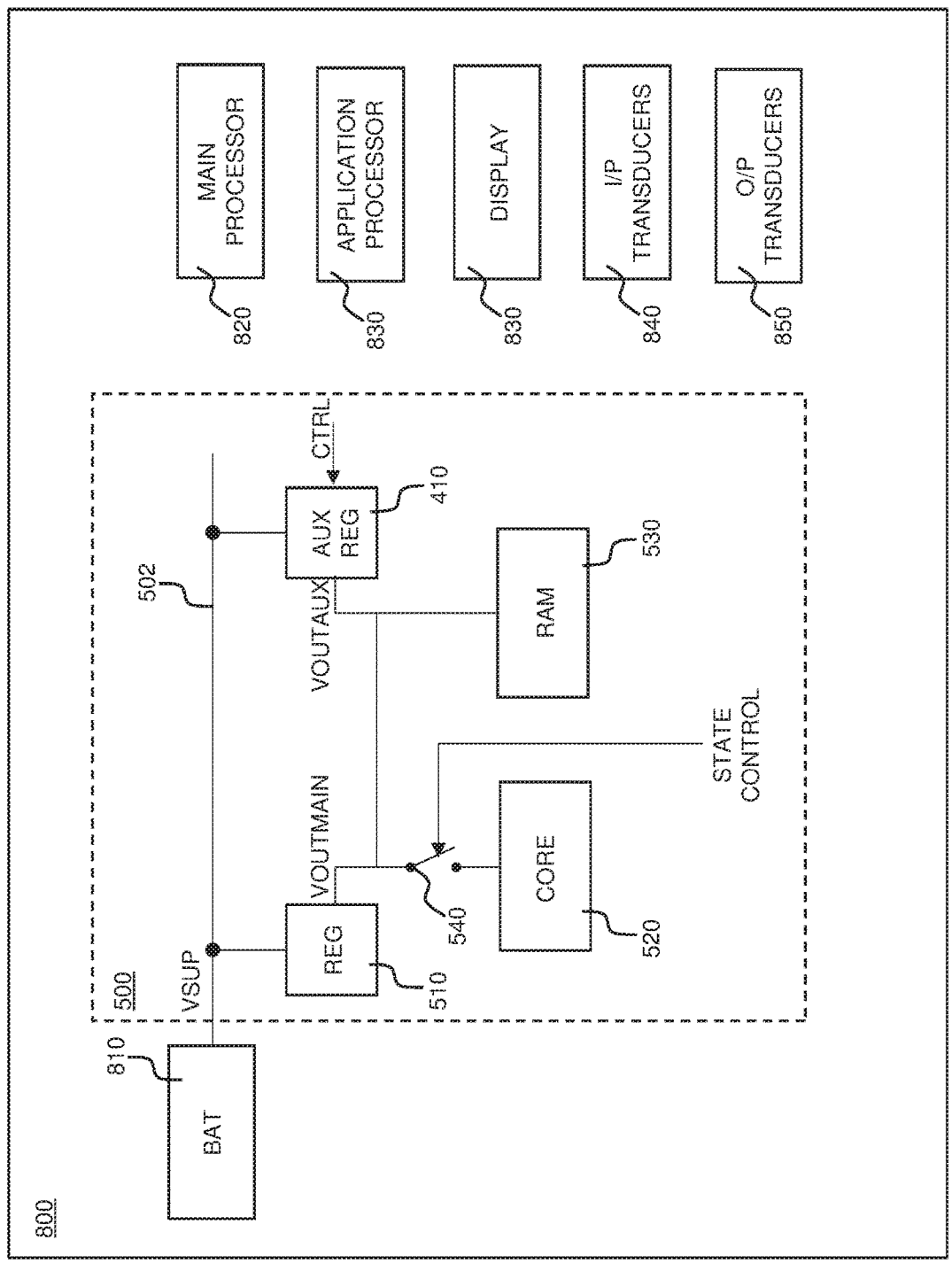
FIG. 8 is a schematic diagram illustrating a host device incorporating voltage regulator circuitry according to the present disclosure.

As discussed above, the voltage regulator circuitry 410 of FIG. 4 and/or the system 500 of FIG. 5 may be incorporated in a host device such as a mobile telephone, a tablet or laptop computer, portable media player, a gaming device, a wearable device or the like, or an accessory device (e.g. headphones, earphones, earbuds, a headset etc.). FIG. 8 is a schematic representation of such a device.

As shown in FIG. 8, the host device 800 may include an on-board battery 800 which provides a supply voltage VSUP to a voltage supply rail 502 of a system 500 of the kind described above with reference to FIG. 5.

The host device 800 may also include a main processor 820, an applications processor 830, and a display 840. The host device 800 may also include one or more input transducers and/or sensors 840, such as one or more microphones, touch screens, touch sensors, force sensors, switches, buttons, light sensors and the like. The host device 800 may also include one or more output transducers 850 such as one or more speakers, haptic output transducers, lights and the like.

As described above, the main processor 820 or the applications processor may act as a central controller for the system 500 to control the operation of the system 500 and the main and auxiliary voltage regulation circuitry 510, 410 by asserting and de-asserting control signals in accordance with the sequence described above with reference to FIG. 6.

As will be apparent from the discussion above, the circuitry of the present disclosure provides improved voltage regulator circuitry which is able to operate selectively in either a closed-loop mode, in which the voltage regulator circuitry is able to output a highly accurate and stable regulated output voltage, and an open-loop mode, in which the voltage regulator circuitry is able to quickly reach a desired output voltage. Thus the voltage regulator circuitry of the present disclosure is able to supply an accurate regulated output voltage to meet a steady state supply voltage requirement of a load (e.g. a RAM), and also to supply quickly a less accurate voltage to accommodate transient changes in the load demand. This is particularly useful in systems in which transient changes in the load demand can be predicted, e.g. in a host device such as a mobile telephone, tablet or laptop computer, portable media player, gaming device, wearable device or the like, or an accessory device (e.g. headphones, earphones, earbuds, a headset etc.) which may be required to enter a low-power or hibernate mode whilst still retaining data such as boot data stored in RAM.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A system comprising:
   first voltage regulator circuitry operable to supply a first regulated output voltage to a load;
   second voltage regulator circuitry operable to supply a second regulated output voltage to the load; and
   controller circuitry operative to selectively enable one of the first and second regulator circuitry and disable the other of the first and second regulator circuitry so as to supply either the first regulated output voltage or the second regulated output voltage to the load;
   wherein the second voltage regulator circuitry is selectively operable in either:
      an open-loop mode in which the second regulated output voltage is regulated based on a reference voltage; or
      a closed-loop mode in which the second regulated output voltage is regulated based on the reference voltage and a voltage indicative of the second regulated output voltage; and
   wherein the system is configured to control the operation of the first and second voltage regulator circuitry such that:
      the second voltage regulator circuitry is enabled for operation in its open loop mode prior to disabling the first voltage regulator circuitry such that the second voltage regulator circuitry is able to supply the second regulated output voltage to the load at a magnitude that is sufficient to meet a minimum supply voltage requirement of the load during a transient load spike that occurs immediately after the first voltage regulator circuitry has been disabled.

2. A system according to claim 1 wherein the system is configured to control the operation of the second voltage regulator circuitry such that:
   when the second voltage regulator circuitry is enabled, the second voltage regulator circuitry is operative in the open-loop mode for a first period of time; and
   after expiry of the first period of time, the second voltage regulator circuitry is operative in the closed-loop mode.

3. A system according to claim 1 wherein the system is configured to control the operation of the second voltage regulator circuitry such that:
   when the second voltage regulator circuitry is operative in the closed-loop mode a magnitude of the second regulated output voltage decreases over time.

4. A system according to claim 3 wherein the system is configured to control the operation of the second voltage regulator circuitry such that the magnitude of the second regulated output voltage decreases in one or more steps over time.

5. A system according to claim 1 wherein the first and second voltage regulator circuitry comprise low drop-out regulator circuitry.

6. A system according to claim 1 wherein the second voltage regulator circuitry has lower power consumption than the first voltage regulator circuitry.

7. A system according to claim 1 wherein the load comprises RAM.

8. A device comprising the system according to claim 1, wherein the device comprises a mobile telephone, a tablet or laptop computer, a portable media player, a gaming device, a wearable device or an accessory device.

\* \* \* \* \*